(12) United States Patent
Chuang

(10) Patent No.: US 12,261,137 B2
(45) Date of Patent: Mar. 25, 2025

(54) BONDING STRUCTURE AND METHOD FOR FORMING THE SAME

(71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 498 days.

(21) Appl. No.: 17/668,785

(22) Filed: Feb. 10, 2022

(65) Prior Publication Data

US 2023/0005868 A1  Jan. 5, 2023

Related U.S. Application Data

(63) Continuation of application No. PCT/CN2021/117197, filed on Sep. 8, 2021.

(30) Foreign Application Priority Data

Jul. 1, 2021  (CN) .......................... 202110746106.6

(51) Int. Cl.
*H01L 23/00* (2006.01)
*H01L 21/768* (2006.01)
(Continued)

(52) U.S. Cl.
CPC ........ *H01L 24/08* (2013.01); *H01L 21/76898* (2013.01); *H01L 23/481* (2013.01);
(Continued)

(58) Field of Classification Search
CPC ... H01L 24/08; H01L 21/76898; H01L 24/05; H01L 25/0657; H01L 2224/08146; H01L 2224/80001; H01L 2225/06541
See application file for complete search history.

(56) References Cited

U.S. PATENT DOCUMENTS 9,640,509 B1  5/2017 Yang
2015/0021789 A1  1/2015 Lin
(Continued)

FOREIGN PATENT DOCUMENTS

CN  105280509 B  4/2018

OTHER PUBLICATIONS

European Patent Office, Extended European Search Report Issued in Application No. 21947874.0, Nov. 28, 2024, Germany, 8 pages.

*Primary Examiner* — Mamadou L Diallo
(74) *Attorney, Agent, or Firm* — Kilpatrick Townsend & Stockton LLP

(57) ABSTRACT

A semiconductor structure is provided. The semiconductor structure includes a first substrate, and a first bonding structure and a first conductive via which are formed in the first substrate. The first bonding structure includes a first metal layer and a second metal layer with a melting point lower than a melting point of the first metal layer. The first metal layer includes a first surface and a second surface arranged opposite to each other. The first surface of the first metal layer is provided with a first groove, and the second metal layer is arranged in the first groove. The first conductive via is in contact with the second surface of the first metal layer. A projection of the first conductive via coincides with a projection of the first groove in a direction perpendicular to the first surface of the first metal layer.

14 Claims, 5 Drawing Sheets

(51) Int. Cl.
*H01L 23/48* (2006.01)
*H01L 25/065* (2023.01)

(52) U.S. Cl.
CPC .............. *H01L 24/03* (2013.01); *H01L 24/05* (2013.01); *H01L 24/80* (2013.01); *H01L 25/0657* (2013.01); H01L 2224/0508 (2013.01); H01L 2224/08146 (2013.01); H01L 2224/80001 (2013.01)

(56) References Cited

U.S. PATENT DOCUMENTS

| | | |
|---|---|---|
| 2020/0051937 A1 | 2/2020 | Uzoh et al. |
| 2021/0134753 A1* | 5/2021 | Lee ........................ H01L 25/50 |
| 2021/0296269 A1* | 9/2021 | Sharangpani ........... H01L 24/06 |
| 2021/0398929 A1* | 12/2021 | Kim .................... H01L 23/3157 |
| 2022/0084948 A1* | 3/2022 | Kang .................... H01L 23/481 |
| 2022/0102290 A1* | 3/2022 | Shih ...................... H01L 23/481 |
| 2022/0336394 A1* | 10/2022 | Ishikawa ................. H01L 24/06 |
| 2023/0142435 A1* | 5/2023 | Guo ..................... H10B 12/033 257/296 |

* cited by examiner

BONDING STRUCTURE AND METHOD FOR FORMING THE SAME

CROSS-REFERENCE TO RELATED APPLICATIONS

This is a continuation application of International Patent Application No. PCT/CN2021/117197, filed on Sep. 8, 2021, which claims priority to Chinese Patent Application No. 202110746106.6, filed on Jul. 1, 2021. The disclosures of International Patent Application No. PCT/CN2021/117197 and Chinese Patent Application No. 202110746106.6 are incorporated by reference herein in their entireties.

TECHNICAL FIELD

The present disclosure relates to, but is not limited to, a semiconductor structure and a method for forming a semiconductor structure.

BACKGROUND

Three-dimensional integrated circuits can improve the packaging density and the circuit operating speed, and realize novel multi-functional devices and circuit systems. At present, various semiconductor manufacturers are working on the three-dimensional integrated circuits.

In the three-dimensional integrated circuit, bonding between one wafer and another will be involved. In the related art, the bonding between one wafer and the other wafer is mainly realized by copper-copper bonding.

However, the copper-copper bonding in the related art is prone to failure, and the bonding performance needs to be improved.

SUMMARY

An embodiment of the present disclosure provides a semiconductor structure. The semiconductor structure includes a first substrate, and a first bonding structure and a first conductive via which are formed in the first substrate. The first bonding structure includes a first metal layer and a second metal layer with a melting point lower than a melting point of the first metal layer. The first metal layer includes a first surface and a second surface arranged opposite to each other. The first surface of the first metal layer is provided with a first groove, and the second metal layer is arranged in the first groove. The first conductive via is in contact with the second surface of the first metal layer. A projection of the first conductive via coincides with a projection of the first groove in a direction perpendicular to the first surface of the first metal layer.

An embodiment of the present disclosure further provides a method for forming a semiconductor structure, which includes the following operations. A first substrate is provided. A first bonding structure and a first conductive via are formed in the first substrate.

The first bonding structure includes a first metal layer and a second metal layer with a melting point lower than a melting point of the first metal layer. The operation that the first bonding structure is formed includes the following operations. The first metal layer including a first surface and a second surface arranged opposite to each other are formed. A first groove is formed on the first surface of the first metal layer. The second metal layer is formed in the first groove. The first conductive via is in contact with the second surface of the first metal layer, and a projection of the first conductive via coincides with a projection of the first groove in a direction perpendicular to the first surface of the first metal layer.

DETAILED DESCRIPTION

Figure 1:
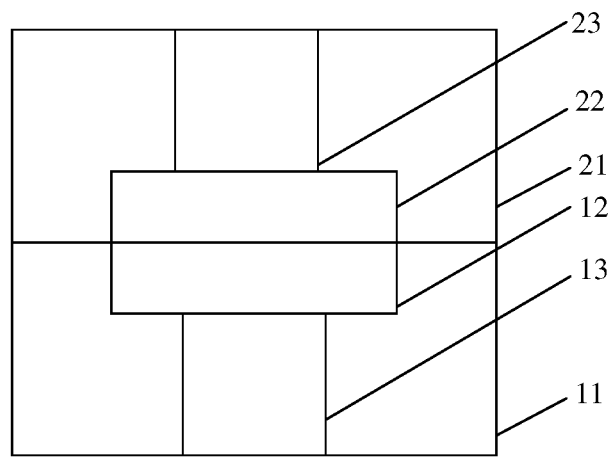
FIG. 1 is a schematic diagram of a semiconductor structure in the related art.

Exemplary embodiments of the present disclosure will be described in more detail below with reference to the accompanying drawings. Although the exemplary embodiments of the present disclosure are shown in the accompanying drawings, it should be understood that the present disclosure can be implemented in various forms and cannot be limited by the embodiments illustrated herein. On the contrary, these embodiments are provided to more thoroughly understand the present disclosure and to completely convey the scope of the present disclosure to those skilled in the art.

In the following description, numerous specific details are set forth in order to provide a more thorough understanding of the present disclosure. However, it will be apparent to those skilled in the art that the present disclosure can be implemented without one or more of these details. In other examples, in order to avoid confusion with the present disclosure, some technical features known in the art are not described. That is, all the features of the actual embodiments are not described here, and the well-known functions and structures are not described in detail.

In the accompanying drawings, the sizes and relative size of layers, regions, and elements may be exaggerated for clarity. The same reference numerals denote the same elements from beginning to end.

It should be understood that, when an element or layer is described as being "on", "adjacent to", "connected to" or "coupled to" another element or layer, it can be directly on, adjacent to, connected to, or coupled to the other element or layer, or there can be an intermediate element or layer. In contrast, when an element is described as being "directly on", "directly adjacent to", "directly connected to" or "directly coupled to" another element or layer, there are no intermediate element or layer. It should be understood that although the terms "first", "second", "third" and so on may be used to describe various elements, components, regions, layers, and/or portions, these elements, components, regions, layers, and/or portions should not be limited by these terms. These terms are used merely to distinguish an element, component, region, layer, or portion from another element, component, region, layer, or portion. Therefore, a first element, component, region, layer, or portion discussed below may be described as a second element, component, region, layer, or portion without departing from the teachings of the present disclosure. When the second element, component, region, layer or portion is discussed, it does not mean that the first element, component, region, layer or portion is necessarily present in the present disclosure.

Spatial relation terms such as "below", "under", "lower", "beneath", "above", and "on" may be used herein for convenience of description to describe a relationship between an element or feature and another element or feature illustrated in the figures. It should be understood that, in addition to the orientations shown in the figures, the spatial relation terms are intended to include different orientations of devices in use and operation. For example, if the devices in the figures are turned over, then the element or feature described as "under" or "beneath" or "below" another element or feature would then be oriented as "above" the other element or feature. Therefore, the exemplary terms "under" and "below" may include both orientations of above and below. The device may be otherwise oriented (rotated by 90 degrees or in other orientations) and the spatial descriptions used herein may be interpreted accordingly.

Terms used herein are for the purpose of describing specific embodiments only and are not intended to be limiting of the present application. As used herein, "a/an", "one", and "the" in singular forms are also intended to include a plural form unless the context clearly indicates other forms. It should also be understood that the terms "consist" and/or "include" when used in the description, determine presence of the features, integers, steps, operations, elements, and/or components, but do not exclude the presence or addition of one or more other features, integers, steps, operations, elements, components, and/or groups. As used herein, the term "and/or" includes any and all combinations of the related listed items.

FIG. 1 is a schematic diagram of a semiconductor structure in the related art. As shown in the figure, the semiconductor structure includes a first substrate 11, a first bonding structure 12 formed in the first substrate 11, a first conductive via 13 formed in the first substrate 11 and connected to the first bonding structure 12, a second substrate 21, a second bonding structure 22 formed in the second substrate 21, and a second conductive via 23 formed in the second substrate 21 and connected to the second bonding structure 22. A material of the first bonding structure 12 is copper, and a material of the second bonding structure 22 is also copper. The first bonding structure 12 and the second bonding structure 22 form copper-copper bonding.

However, the copper-copper bonding needs to be mutually bonded under a high temperature condition of 400° C. Since the bonding temperature is relatively high, the selection of many material and processes is limited, disadvantages of shift of element characteristics may occur. In addition, the copper-copper bonding has a relatively high requirement of the surface flatness, which increases the difficulty of the process.

Based on this, the following technical solutions of the embodiments of the present disclosure are provided.

An embodiment of the present disclosure provides a semiconductor structure. The semiconductor structure includes a first substrate, and a first bonding structure and a first conductive via which are formed in the first substrate. The first bonding structure includes a first metal layer and a second metal layer with a melting point lower than a melting point of the first metal layer. The first metal layer includes a first surface and a second surface arranged opposite to each other. The first surface of the first metal layer includes a first groove, and the second metal layer is arranged in the first groove. The first conductive via is in contact with the second surface of the first metal layer. A projection of the first conductive via coincides with a projection of the first groove in a direction perpendicular to the first surface of the first metal layer.

The first bonding structure provided by the embodiment of the present disclosure includes the second metal layer with a relatively low melting point. Compared with other bonding structures only including the first metal layer, the first bonding structure provided by the embodiment of the present disclosure may perform bonding at a lower temperature. Meanwhile, the projection of the first conductive via coincides with the projection of the first groove in the direction perpendicular to the first surface of the first metal layer. During bonding, the first conductive via is heated and expanded, which promotes the fusion between the second metal layer in the first groove and other bonding structures to form an intermetallic compound. Therefore, even if there is a small gap between the first bonding structure and other bonding structures, the first bonding structure and other bonding structures can be successfully fused, which lowers the requirement of the flatness of the bonding surface during bonding.

In order to make the foregoing objectives, features and advantages of the present disclosure more apparent and lucid, various embodiments of the present disclosure are described in detail below with reference to the accompanying drawings. When the embodiments of the present disclosure are described in detail, for the convenience of description, a schematic diagram may be partially enlarged not according to a general scale, and the schematic diagram is only an example, and should not limit the protection scope of the present disclosure herein.

Figure 2:
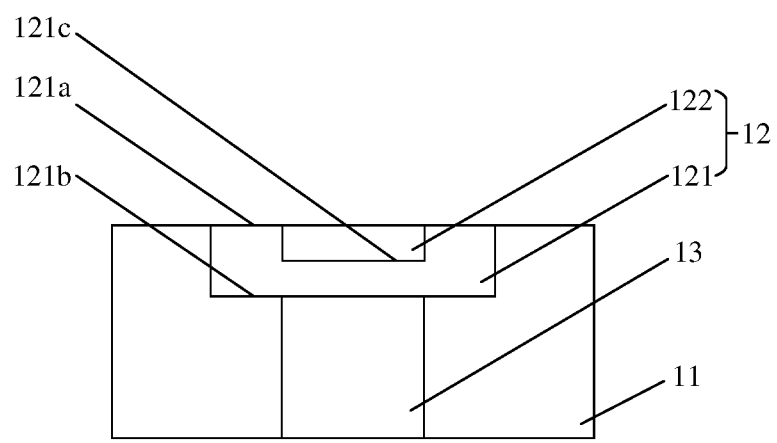
FIG. 2 is a schematic diagram of a semiconductor structure according to an embodiment of the present disclosure.

FIG. 2 is a schematic diagram of a semiconductor structure according to an embodiment of the present disclosure. As shown in the figure, the semiconductor structure includes a first substrate 11, and a first bonding structure 12 and a first conductive via 13 which are formed in the first substrate 11. The first bonding structure 12 includes a first metal layer 121 and a second metal layer 122. A melting point of the second metal layer 122 is lower than a melting point of the first metal layer 121. The first metal layer 121 includes a first surface 121a and a second surface 121b arranged opposite to each other. The first surface 121a includes a first groove 121c, and the second metal layer 122 is arranged in the first groove 121c. The first conductive via 13 is in contact with the second surface 121b of the first metal layer 121. A projection of the first conductive via 13 coincides with a projection of the first groove 121c in a direction perpendicular to the first surface 121a of the first metal layer 121.

It should be noted that the projection of the first conductive via 13 coincides with the projection of the first groove 121c in the direction perpendicular to the first surface 121a of the first metal layer 121, that is, a section of the first conductive via 13 parallel to the first surface 121a and a section of the first groove 121c parallel to the first surface 121a have the same shapes and sizes. In this way, it is possible to increase a thermal expansion thrust of the first conductive via 13 to the second metal layer 122 in a molten state during bonding, thereby improving the bonding reliability.

In one specific embodiment, the first conductive via 13 and the first groove 121c are in the cylindrical shape, and a diameter of the first groove 121c is the same as a diameter of the first conductive via 13.

The first conductive via 13 includes, but is not limited to, a Through Silicon Via (TSV). The first conductive via 13 is configured to transmit electrical signals.

In one specific embodiment, a material of the first conductive via 13 is the same as a material of the first metal layer 121.

In one specific embodiment, the material of the first conductive via 13 includes, but is not limited to, copper. A material of the first substrate 11 may be silicon, germanium, gallium nitride, gallium arsenide, indium phosphide (InP), Silicon-On-Insulator (SOI), Germanium-On-Insulator (GeOI), etc., but is not limited thereto, and may also be other materials that can be used as a substrate.

The first conductive via 13 includes, but is not limited to, a Through Silicon Via (TSV). The first conductive via 13 is configured to transmit electrical signals.

In one embodiment, the first metal layer 121 includes, but is not limited to, at least one of copper or tungsten.

In one embodiment, the second metal layer 122 includes, but is not limited to, at least one of bismuth, cadmium, tin, lead, dysprosium or indium.

Figure 3:
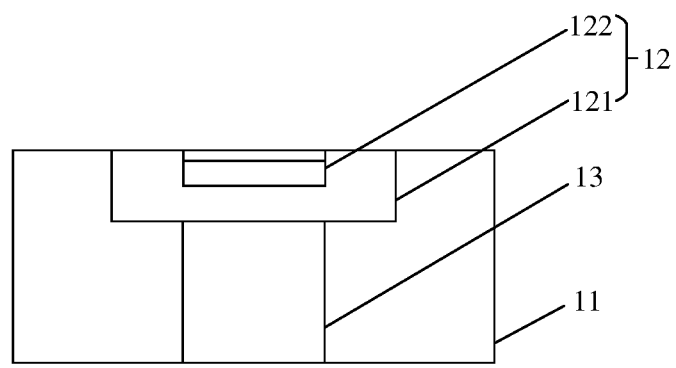
FIG. 3 is a schematic diagram showing a gap is formed above a second metal layer according to an embodiment of the present disclosure.

The second metal layer 122 may completely fill the first groove 121c, or may partially fill the first groove 121c. As shown in FIG. 3, in one embodiment, a thickness of the second metal layer 122 is less than a depth of the first groove 121c. In other words, the second metal layer 122 does not completely fill the first groove 121c. In this way, a gap not filled by the second metal layer 122 is formed at a top portion of the first groove 121c, which can prevent the first conductive via 13 from squeezing, during expansion, the second metal layer 122 from the first groove 121c onto the first surface 121a of the first metal layer 121.

It can be understood that it is not the fact that the thickness of the second metal layer is the thicker the better. In some specific embodiments, the thickness of the second metal layer 122 should be less than 1 µm, such as 0.8 µm.

It should be clarified that a bonding surface of the first bonding structure 12 refers to a surface on which the first bonding structure 12 is bonded to other bonding structures during bonding. It can be understood that the bonding surface includes the first surface 121a of the first metal layer and a surface of the second metal layer exposed by the first groove 121c. In one embodiment, the shape of the bonding surface of the first bonding structure 12 includes, but is not limited to, a circle, an ellipse, or a rectangle.

Figure 4:
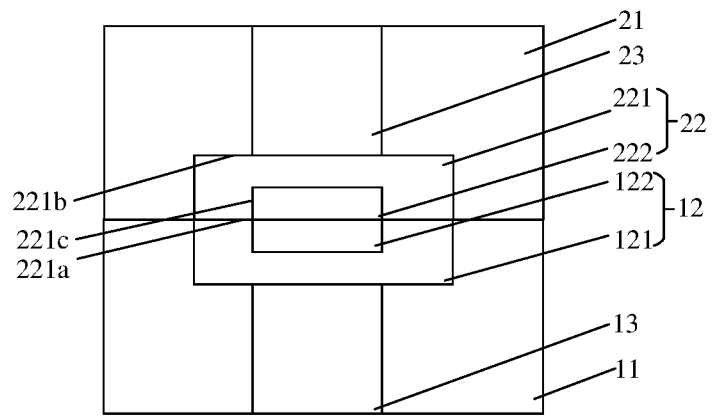
FIG. 4 is a schematic diagram of bonding between a first bonding structure and a second bonding structure according to an embodiment of the present disclosure.

In one embodiment, the semiconductor structure further includes a second substrate 21, and a second bonding structure 22 formed in the second substrate 21. The second bonding structure 22 is bonded to the first bonding structure 12, as shown in FIG. 4.

It should be clarified that a bonding surface of the second bonding structure 22 refers to a surface on which the second bonding structure 22 is bonded to other bonding structures during bonding. In one embodiment, a projection of the bonding surface of the second bonding structure 22 coincides with a projection of the bonding surface of the first bonding structure 12 in a vertical direction. In other words, the shape and size of the bonding surface of the second bonding structure 22 are the same as the shape and size of the bonding surface of the first bonding structure 12. However, it is not limited to this. In other embodiments, the shape and size of the bonding surface of the second bonding structure 22 may also be different from the shape and size of the bonding surface of the first bonding structure 12.

The second bonding structure 22 includes a third metal layer 221. A material of the third metal layer 221 is the same as a material of the first metal layer 121. The third metal layer 221 includes a first surface 221a and a second surface 221b arranged opposite to each other, and the first surface 221a of the third metal layer 221 is bonded to the first bonding structure 12.

In one embodiment, the semiconductor structure further includes a second conductive via 23. The second conductive via 23 is formed in the second substrate 21. The second conductive via 23 is in contact with the second surface 221b of the third metal layer 221.

In one embodiment, the second bonding structure 22 includes a fourth metal layer 222. A material of the fourth metal layer 222 is the same as a material of the second metal layer 122. The first surface 221a of the third metal layer 221 is provided with a second groove 221c, and the fourth metal layer 222 is arranged in the second groove 221c.

In one specific embodiment, a projection of the second conductive via 23 coincides with a projection of the second groove 221c in a direction perpendicular to the first surface 221a of the third metal layer 221. In this way, during bonding, the second conductive via 23 is heated and expanded, so as to promote the fourth metal layer 222 and the first bonding structure 12 to form an intermetallic compound, thereby improving the bonding strength.

Figure 5:
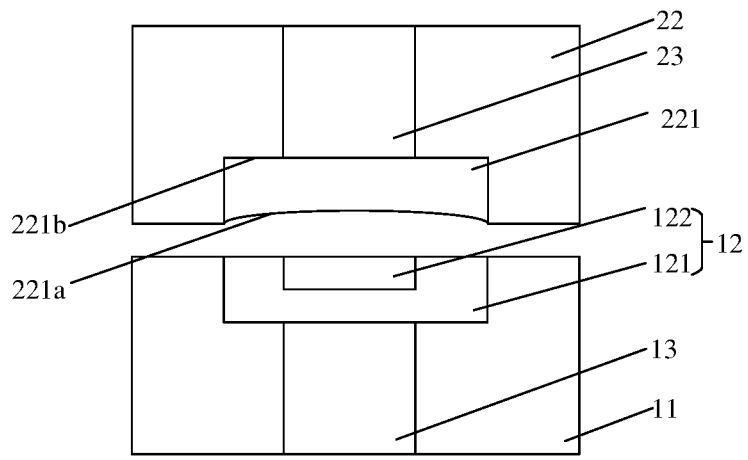
FIG. 5 is a schematic diagram showing a third metal layer is provided with a first surface having a concave shape according to an embodiment of the present disclosure.

In one embodiment, the first surface 221a of the third metal layer 221 has a concave shape, as shown in FIG. 5. In one specific embodiment, the concave shape includes, but is not limited to, a spherical concave shape.

When the third metal layer 221 is bonded to the first bonding structure 12, the first conductive via 13 is heated and expanded, so as to promote the fusion between the molten second metal layer 122 and the first surface 221a of the third metal layer 221 to form an intermetallic compound, thereby improving the bonding strength. Meanwhile, since the second metal layer 122 in the molten state has fluidity, it may fill the space formed by the concave shape, and the bonding reliability may not be affected by the bonding surface having a concave shape.

In order to ensure the bonding reliability, the depth of the concave shape should not be too large. In some embodiments, a maximum depth of the concave shape is comprised between 1 nm and 5 nm.

Figure 6:
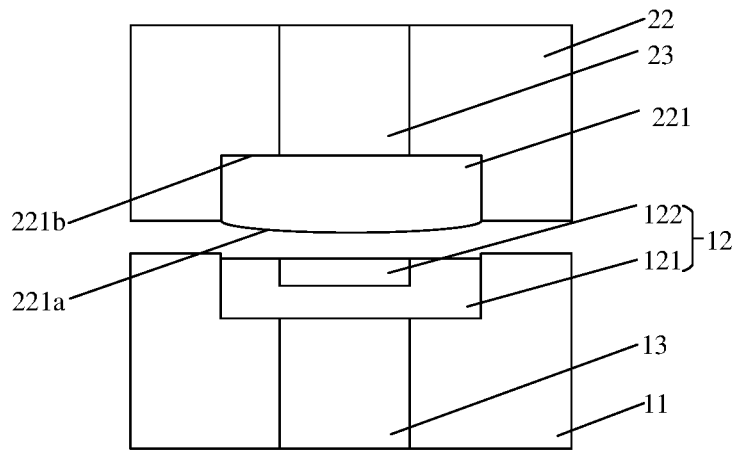
FIG. 6 is a schematic diagram showing a third metal layer is provided with a first surface having a convex shape according to an embodiment of the present disclosure.

In one embodiment, the first surface 221a of the third metal layer 221 has a convex shape, as shown in FIG. 6. In one specific embodiment, the convex shape includes, but is not limited to, a spherical convex shape.

Correspondingly, the bonding surface of the first bonding structure 12 bonded to the third metal layer 221 should be concave toward the interior of the first substrate by 1 nm to 5 nm, so as to accommodate the first surface 221a of the third metal layer 221 having a convex shape.

In summary, due to the compounding effect of a low melting point metal and the thermal expansion effect of the metal, no matter the first surface 221a of the third metal layer 221 has a concave shape or a convex shape, it can be smoothly bonded to the first bonding structure 12, which lowers the requirement of the flatness of the bonding surface during bonding.

Figure 7:
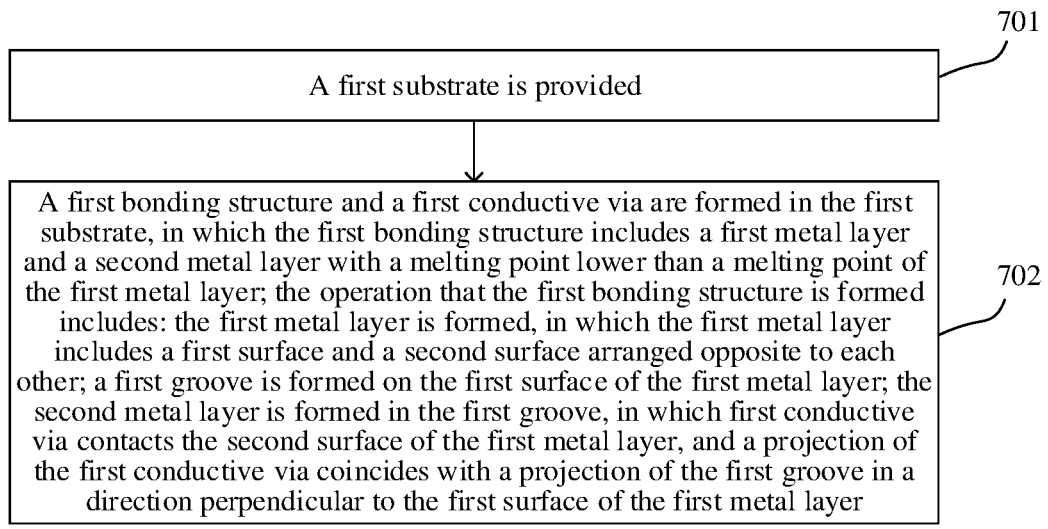
FIG. 7 is a flow chart of a method for forming a semiconductor structure according to an embodiment of the present disclosure.

An embodiment of the present disclosure further provides a method for forming a semiconductor structure. As shown in FIG. 7, the method includes the following operations.

In operation 701, a first substrate is provided.

In operation 702, a first bonding structure and a first conductive via are formed in the first substrate. The first bonding structure includes a first metal layer and a second metal layer with a melting point lower than a melting point of the first metal layer. The operation that the first bonding structure is formed includes the following operations. The first metal layer is formed. The first metal layer includes a first surface and a second surface arranged opposite to each other. A first groove is formed on the first surface of the first metal layer. The second metal layer is formed in the first groove. The first conductive via is in contact with the second surface of the first metal layer. A projection of the first conductive via coincides with a projection of the first groove in a direction perpendicular to the first surface of the first metal layer.

The method for forming the semiconductor structure in the embodiment of the present disclosure is further described in detail below in combination with FIG. 8A to FIG. 8G.

Figure 8A:
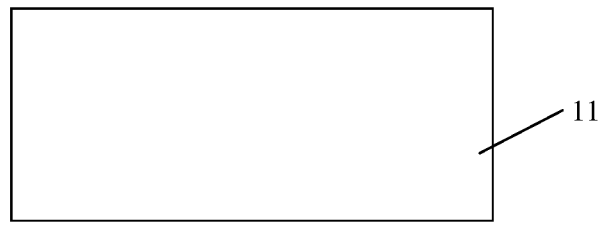
FIGS. 8A-8G are process flow charts of a method for forming a semiconductor structure according to an embodiment of the present disclosure.

Firstly, the operation 701 is performed, in which the first substrate 11 is provided, as shown in FIG. 8A.

A material of the first substrate 11 may be silicon, germanium, gallium nitride, gallium arsenide, indium phosphide (InP), Silicon-On-Insulator (SOI), Germanium-On-Insulator (GeOI), etc., but is not limited thereto, and may also be other materials that can be used as a substrate.

Figure 8B:
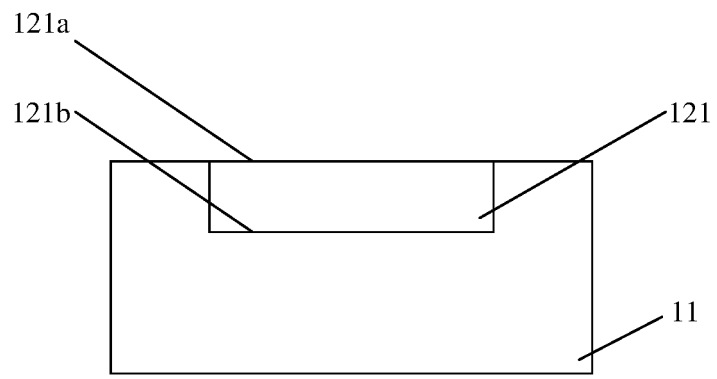
Figure 8C:
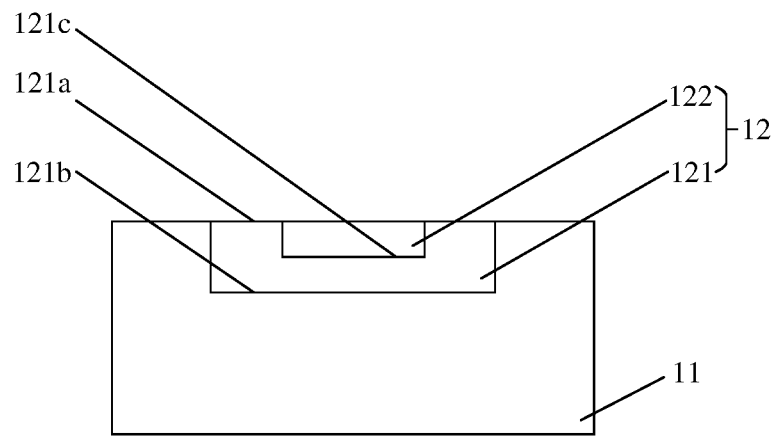
Figure 8D:
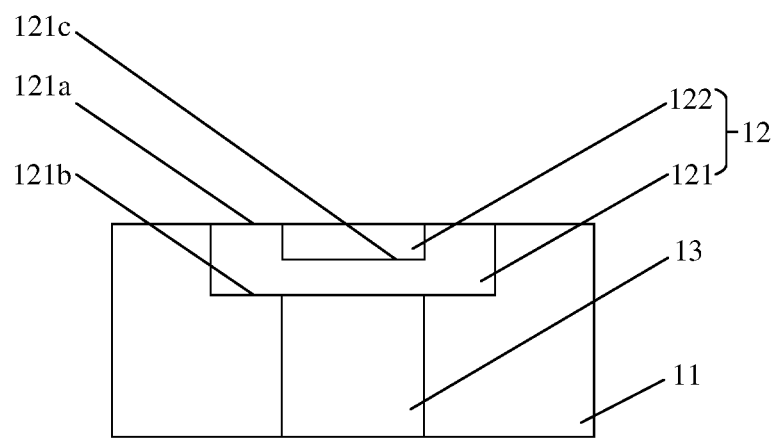

Secondly, the operation 702 is performed, in which the first bonding structure 12 and the first conductive via 13 are formed in the first substrate 11, as shown in FIG. 8B to FIG. 8D. The first bonding structure 12 includes a first metal layer 121 and a second metal layer 122 with a melting point lower than a melting point of the first metal layer 121. The first metal layer 121 includes a first surface 121a and a second surface 121b arranged opposite to each other. A first groove 121c is formed on the first surface 121a of the first metal layer 121, and the second metal layer 122 is arranged in the first groove 121c. The first conductive via 13 is in contact with the second surface 121b of the first metal layer 121. A projection of the first conductive via 13 coincides with a projection of the first groove 121c in a direction perpendicular to the first surface 121a of the first metal layer 121.

FIG. 8B to FIG. 8D show a process of forming the first bonding structure 12 and the first conductive via 13. It should be clarified that this is merely an example, and other operations can also be adopted to form the first bonding structure 12 and the first conductive via 13.

Referring to FIG. 8B, the first metal layer 121 is formed in the first substrate 11. The first metal layer 121 includes the first surface 121a and the second surface 121b arranged opposite to each other. The first surface 121a is exposed by the first substrate 11 for subsequent bonding.

Referring to FIG. 8C, the first groove 121c is formed on the first surface 121a, and the second metal layer 122 is formed in the first groove 121c. The first metal layer 121 and the second metal layer 122 form the first bonding structure 12.

In one embodiment, a surface of the second metal layer 122 exposed by the first groove 121c is flush with the first surface 121a.

In one embodiment, the surface of the second metal layer 122 exposed by the first groove 121c is concave with respective to the first surface 121a toward the interior of the first substrate 11 by a certain distance. In other words, a thickness of the second metal layer 122 is less than a depth of the first groove 121c. In this way, it is possible to prevent the first conductive via 13 from squeezing, during expansion, the second metal layer 122 from the first groove 121c onto the first surface 121a of the first metal layer 121.

Referring to FIG. 8D, the first conductive via 13 is formed in the first substrate 11. The first conductive via 13 is in contact with the second surface 121b. The projection of the first conductive via 13 coincides with the projection of the first groove 121c in the direction perpendicular to the first surface 121a of the first metal layer 121. In this way, during bonding, the first conductive via 13 is heated and expanded, so as to promote the second metal layer 122 and other bonding structures to form an intermetallic compound, thereby improving the bonding strength. Specifically, the first conductive via 13 includes, but is not limited to, a Through Silicon Via (TSV).

Figure 8E:
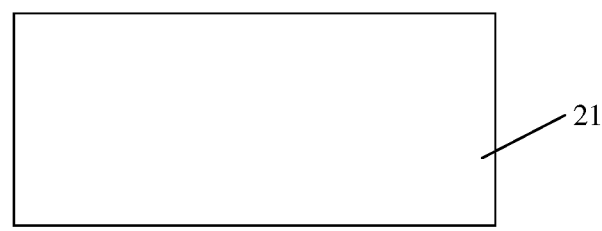
Figure 8F:
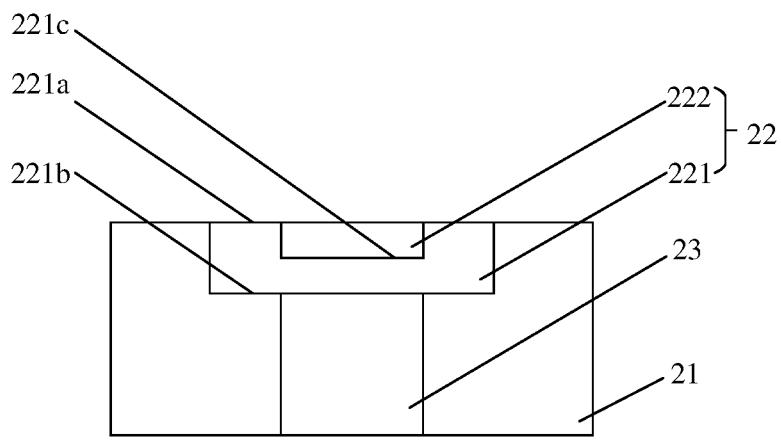
Figure 8G:
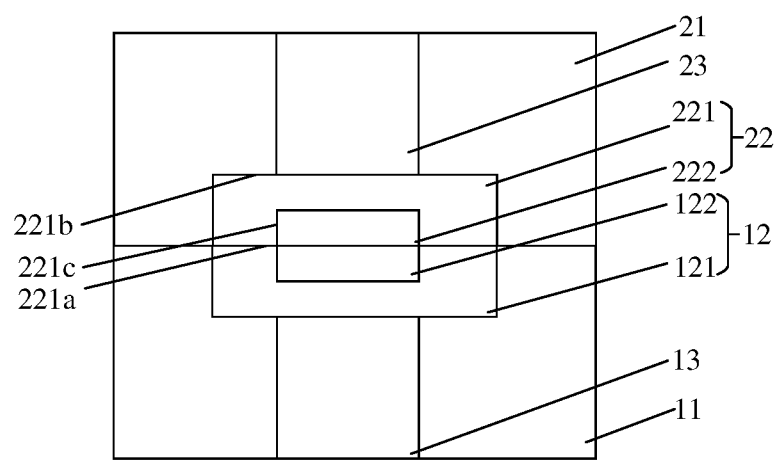

In one embodiment, the method for forming the semiconductor structure further includes the following operations. A second substrate 21 is provided. A second bonding structure 22 is formed in the second substrate 21. The second bonding structure 22 is bonded to the first bonding structure 12, as shown in FIG. 8E to FIG. 8G, Referring to FIG. 8E, the second substrate 21 is provided. A material of the second substrate 21 may be the same as or different from the material of the first substrate 11.

Referring to FIG. 8F, the second bonding structure 22 is formed in the second substrate 21. In one embodiment, the operation that the second bonding structure 22 is formed includes the following operation. A third metal layer 221 is formed. A material of the third metal layer 221 is the same as the material of the first metal layer 121, and the third metal layer 221 includes a first surface 221a and a second surface 221b arranged opposite to each other.

In one embodiment, the method further includes the following operation. A second conductive via 23 is formed in the second substrate 21. The second conductive via 23 is in contact with the second surface 221b of the third metal layer 221.

In one embodiment, the operation that the second bonding structure 22 is formed further includes the following operations. A second groove 221c is formed on the first surface 221a of the third metal layer 221. A fourth metal layer 222 is formed in the second groove 221c. A material of the fourth metal layer 222 is the same as the material of the second metal layer 122.

Referring to FIG. 8G, the second bonding structure 22 is bonded to the first bonding structure 12.

The above only describes the preferred embodiments of the present disclosure, and is not intended to limit the protection scope of the present disclosure. Any modifications, equivalent substitution, improvements made within the spirit and principle of the present disclosure shall be contained within the protection scope of the present disclosure.

The invention claimed is:

1. A semiconductor structure, comprising
a first substrate, and a first bonding structure and a first conductive via which are formed in the first substrate,
wherein the first bonding structure comprises a first metal layer and a second metal layer with a melting point lower than a melting point of the first metal layer, the first metal layer comprises a first surface and a second surface arranged opposite to each other, the first surface of the first metal layer is provided with a first groove, and the second metal layer is arranged in the first groove; and wherein the first conductive via is in contact with the second surface of the first metal layer, and a projection of the first conductive via coincides with a projection of the first groove in a direction perpendicular to the first surface of the first metal layer; and, wherein a thickness of the second metal layer is less than 1um, the second metal layer comprises at least one of bismuth, cadmium, tin, lead, dysprosium or indium, the first metal layer comprises at least one of copper or tungsten, and a bonding surface of the first bonding structure is in the shape of a circle, an ellipse, or a rectangle.

2. The semiconductor structure of claim 1, wherein a thickness of the second metal layer is less than a depth of the first groove.

3. The semiconductor structure of claim 1, further comprising
a second substrate, and a second bonding structure formed in the second substrate, wherein the second bonding structure is bonded to the first bonding structure.

4. The semiconductor structure of claim 3, wherein a shape of a bonding surface of the first bonding structure is the same as a shape of a bonding surface of the second bonding structure, and an area of the bonding surface of the first bonding structure is the same as an area of the bonding surface of the second bonding structure.

5. The semiconductor structure of claim 3, wherein the second bonding structure comprises a third metal layer made of a same material as the first metal layer, the third metal layer comprises a first surface and a second surface arranged opposite to each other, and the first surface of the third metal layer is bonded to the first bonding structure.

6. The semiconductor structure of claim 5, further comprising
a second conductive via, wherein the second conductive via is formed in the second substrate, and the second conductive via is in contact with the second surface of the third metal layer.

7. The semiconductor structure of claim 5, wherein the second bonding structure comprises a fourth metal layer made of a same material as the second metal layer, the first surface of the third metal layer is provided with a second groove, and the fourth metal layer is arranged in the second groove.

8. The semiconductor structure of claim 7, further comprising
a second conductive via, wherein the second conductive via is formed in the second substrate, and the second conductive via is in contact with the second surface of the third metal layer, and wherein a projection of the second conductive via coincides with a projection of the second groove in a direction perpendicular to the first surface of the third metal layer.

9. The semiconductor structure of claim 5, wherein the first surface of the third metal layer has a concave shape, and a maximum depth of the concave shape is comprised between 1 nm and 5 nm.

10. The semiconductor structure of claim 5, wherein the first surface of the third metal layer has a convex shape, and a maximum height of the convex shape is comprised between 1 nm and 5 nm.

11. The semiconductor structure of claim 10, wherein a bonding surface of the first bonding structure is concave toward the first substrate by 1 nm to 5 nm to accommodate the first surface of the third metal layer having the convex shape.

12. A method for forming a semiconductor structure, comprising:
providing a first substrate, and forming a first bonding structure and a first conductive via in the first substrate;
wherein the first bonding structure comprises a first metal layer and a second metal layer with a melting point lower than a melting point of the first metal layer, wherein forming the first bonding structure comprises: forming the first metal layer comprising a first surface and a second surface arranged opposite to each other; forming a first groove on the first surface of the first metal layer; and forming the second metal layer in the first groove; and
wherein the first conductive via is in contact with the second surface of the first metal layer, and a projection of the first conductive via coincides with a projection of the first groove in a direction perpendicular to the first surface of the first metal layer; and, wherein the method further comprises:
providing a second substrate;
forming a second bonding structure in the second substrate;
and bonding the second bonding structure to the first bonding structure; wherein
forming the second bonding structure comprises: forming a third metal layer, wherein a material of the third metal layer is the same as a material of the first metal layer, and the third metal layer comprises a first surface and a second surface arranged opposite to each other; wherein
bonding the second bonding structure to the first bonding structure comprises:
bonding the first surface of the third metal layer to a bonding surface of the first bonding structure.

13. The method for forming the semiconductor structure of claim 12, further comprising:
forming a second conductive via in the second substrate, wherein the second conductive via is in contact with the second surface of the third metal layer.

14. The method for forming the semiconductor structure of claim 12, wherein
forming the second bonding structure further comprises: forming a second groove on the first surface of the third metal layer; and forming a fourth metal layer in the second groove, wherein a material of the fourth metal layer is the same as a material of the second metal layer.

* * * * *